United States Patent
Kwon

(10) Patent No.: US 8,243,528 B2
(45) Date of Patent: Aug. 14, 2012

(54) ERASE METHOD OF FLASH DEVICE

(75) Inventor: Il Young Kwon, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 373 days.

(21) Appl. No.: 12/491,668

(22) Filed: Jun. 25, 2009

(65) Prior Publication Data

US 2010/0027353 A1    Feb. 4, 2010

(30) Foreign Application Priority Data

Aug. 1, 2008   (KR) .................. 10-2008-0075724

(51) Int. Cl.
*G11C 11/34*    (2006.01)

(52) U.S. Cl. ......... 365/185.33; 365/185.05; 365/185.17; 365/185.18; 365/185.21; 365/185.25; 365/185.29; 365/189.05; 365/205; 365/218

(58) Field of Classification Search .............. 365/185, 365/185.05, 185.17, 185.18, 185.21, 185.25, 365/185.29, 185.33, 189.05, 205, 218
See application file for complete search history.

(56) References Cited

U.S. PATENT DOCUMENTS

| | | | |
|---|---|---|---|
| 2007/0230253 A1* | 10/2007 | Kim | 365/185.29 |
| 2007/0238286 A1* | 10/2007 | Kwon | 438/627 |
| 2009/0003084 A1* | 1/2009 | Kim et al. | 365/185.29 |

\* cited by examiner

*Primary Examiner* — Fernando Hidalgo
(74) *Attorney, Agent, or Firm* — IP & T Group LLP

(57) ABSTRACT

In an erase method of a flash device, including a page buffer configured to transfer a virtual voltage in response to a discharge signal and further comprising strings each including memory cells and coupled to the page buffer via a respective bit line, applying a ground voltage to a gate of each of the memory cells and erasing the memory cells coupled to a selected bit line by supplying the virtual voltage wherein the virtual voltage is applied to the selected bit line and a unselected bit line.

20 Claims, 2 Drawing Sheets

ERASE METHOD OF FLASH DEVICE

CROSS-REFERENCES TO RELATED APPLICATIONS

Priority to Korean patent application number 10-2008-0075724 filed on Aug. 1, 2008, the entire disclosure of which is incorporated by reference herein, is claimed.

BACKGROUND

An embodiment relates to the erase method of a flash device and, more particularly, to the erase method of a flash device, which is capable of simplifying the erase operation and also improving the distributions of a threshold voltage of an erase state.

The operations of a semiconductor device may include a program operation, an erase operation, and a read operation. During the program operation and the erase operation, a verification operation is performed. From among them, the erase operation is described by taking a flash device as an example.

The erase operation of the flash device may be performed on a memory-cell-block basis.

In more detail, the erase operation may be performed by supplying the bit line of a selected memory cell block with an erase voltage (for example, 20V) and all word lines of the selected memory cell block with a ground voltage (for example, 0V). At this time, a selected bit line is supplied with the erase voltage, and unselected bit lines are floated or applied with a ground voltage (for example, 0V). In a flash device, the distance between bit lines is generally narrower than the distance between other wirings (for example, gate lines). Accordingly, as the potential difference between neighbor bit lines increases, an interference effect is likely to occur. For example, since the potential difference between a selected bit line and an unselected bit line is large (for example, about 20 V), capacitive coupling may occur between the bit lines, where the voltage of the unselected bit line may rise due to the capacitive coupling. To prevent this problem, operations for preventing such an unintended voltage rise are desired. However, such operations often make complicated the erase operation and may also increase the time for performing the erase operation.

BRIEF SUMMARY

According to an embodiment, when the erase operation of a flash device, a virtual voltage supplied from a bit line selection unit, not a page buffer, is used as voltage applied to a bit line, and the virtual voltage is supplied to both even and odd bit lines. Accordingly, the erase operation can be simplified and, during an erase verification operation, an interference effect between the bit lines can be reduced.

In an erase method of a flash device according to an embodiment, including a page buffer configured to transfer a virtual voltage in response to a discharge signal and further comprising strings including memory cells and coupled to the page buffer via a respective bit line, a gate of each of the memory cells is supplied with a ground voltage, and erase verification is performed on a memory cell coupled to a selected bit line by supplying a virtual voltage to both a selected bit line and an unselected bit line of the respective bit lines.

The page buffer includes a bit line selection unit configured to receive the virtual voltage and electrically couple a selected bit line of the respective bit lines and the page buffer, a precharge switch configured to operate in response a precharge signal and transfer a power source voltage to a sensing node, a first switch configured to operate in response a sense signal and electrically couple the bit line selection unit and the sensing node, a latch configured to store or sense data, a second switch configured to operate in response to a transfer signal and couple the sensing node and the latch, and a reset switch configured to operate depending on a level of the sensing node and reset the latch.

When the virtual voltage is transferred to a bit line, the precharge switch is turned on so that the power source voltage is applied to the sensing node, and a voltage level of the bit line is detected.

In supplying the power source voltage to the sensing node, the selected bit line and the sensing node are electrically connected.

In sensing the voltage level of the bit line, a change in a voltage level of the sensing node is detected by inactivating the precharge signal and activating the reset signal.

A capacitor coupled to the sensing node between the first switch and the second switch is further included.

When the capacitor is activated, a potential of the sensing node rises in response to the activation.

In an erase method of a flash device according to another embodiment, where the flash device includes a page buffer coupled to strings of memory cells via respective bit lines, the erase method includes supplying a gate of each of the memory cells of the strings with a ground voltage, and during the supply of the ground voltage to the gate of each of the memory cells, performing erase verification on a memory cell coupled to a selected bit line by supplying a virtual voltage in response to a discharge signal to both a selected bit line and an unselected bit line of the respective bit lines.

DESCRIPTION OF SPECIFIC EMBODIMENT

Hereinafter, the present disclosure will be described in detail in connection with an embodiment with reference to the accompanying drawings. The figures are provided to allow those having ordinary skill in the art to understand the scope of embodiments of the disclosure.

Figure 1:
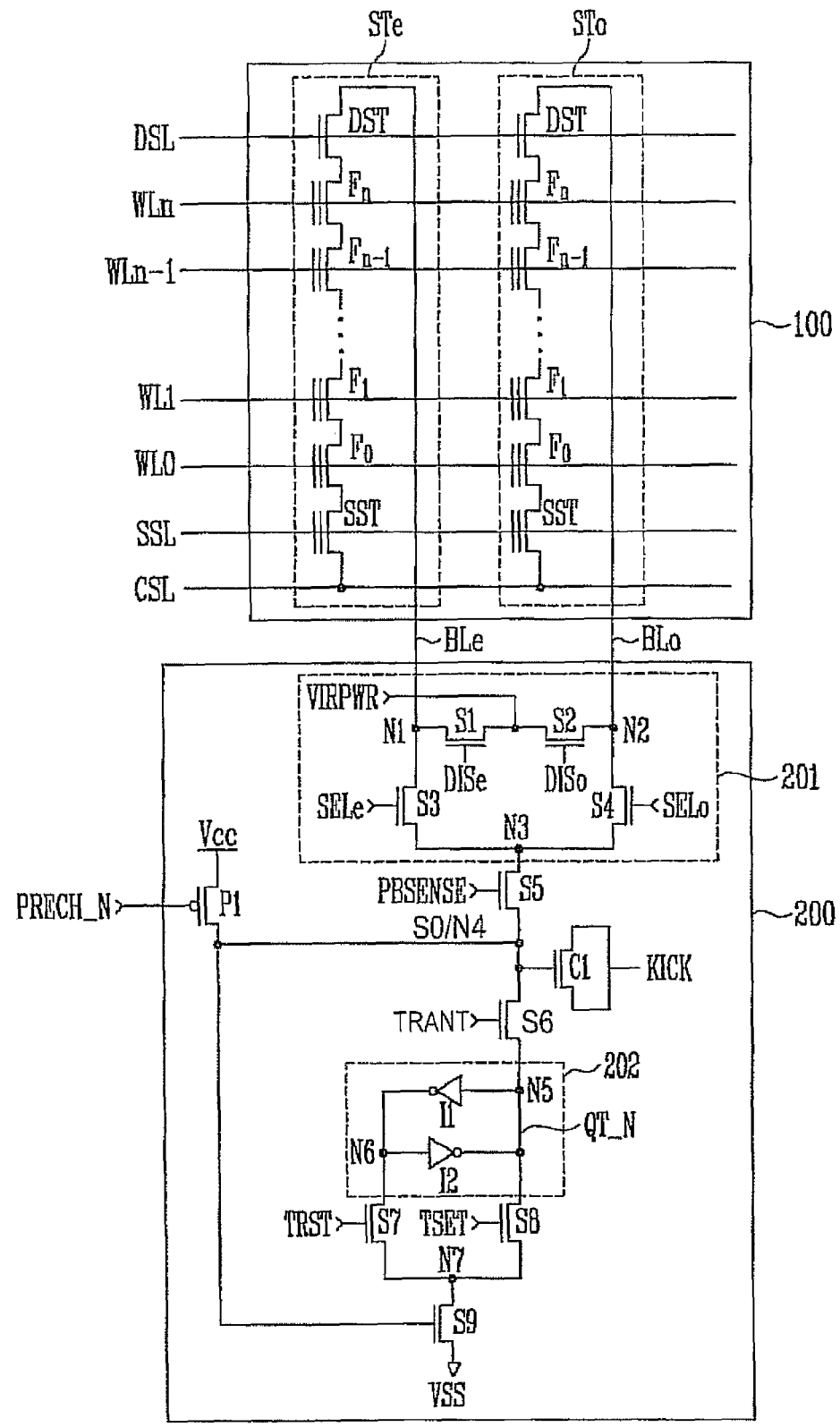
FIG. 1 is a circuit diagram showing a memory cell array and a page buffer of a flash device.

FIG. 1 is a circuit diagram showing a memory cell array and a page buffer of a flash device.

Referring to FIG. 1, the flash device includes a memory cell array 100 and a page buffer 200. The memory cell array 100 includes a number of memory cell strings Ste, STo, etc. From among the memory cell strings, only the even string STe and odd string STo are illustrated, for convenience of description. The even string STe is described below in more detail. The even string STe includes a drain select transistor DST, memory cells F0 to Fn (where n is an integer), and a source select transistor SST. The drain of the drain select transistor DST is coupled to an even bit line BLe, and the source of the source select transistor SST is electrically coupled to a common source line CSL. The gate of the drain select transistor DST is coupled to a drain select line DSL, and the gate of the source select transistor SST is coupled to a source select line SSL. The memory cells F0 to Fn are in series coupled between the drain select transistor DST and the source select transistor SST. The gates of the memory cells F0 to Fn, included in the strings STe and STo, are coupled to respective word lines WL0 to WLn.

The page buffer 200 is electrically coupled to the memory cell array 100 via the even bit line BLe and the odd bit line BLo. It is to be noted that parts of the page buffer 200 that do not need to be included in the illustration in clearly explaining the embodiment are omitted to avoid obfuscating the embodiment. The page buffer 200 includes a bit line selection unit 201, a latch 202, a capacitor C1, a precharge switch P1, and fifth to ninth switches S5 to S9. The bit line selection unit 201 includes first to fourth switches S1 to S4. Each of the first to fourth switches S1 to S4 may be implemented using an NMOS transistor. The first and second switches S1 and S2 are coupled in series between a first node N1, which is electrically coupled to the even bit line BLe, and a second node N2, which is electrically coupled to the odd bit line BLo. A terminal to which a virtual voltage VIRPWR is supplied is coupled between the first and second switches S1 and S2. The third switch S3 is coupled between the first node N1 and a third node N3, and the fourth switch S4 is coupled between the second node N2 and the third node S3.

Each of the fifth to ninth switches S5 to S9 may be implemented using an NMOS transistor. The fifth switch S5 is coupled between the third node N3 and a fourth node N4, which is electrically coupled to a sensing node SO. The gate of the capacitor C1 is coupled to the fourth node N4. The sixth switch S6 is coupled between the fourth node N4 and a fifth node N5. The latch 202 includes a first inverter I1 and a second inverter I2. The first and second inverters I1 and I2 are coupled in parallel between the fifth node N5 and a sixth node N6. The seventh switch S7 is coupled between the sixth node N6 and a seventh node N7, and the eighth switch S8 is coupled between the fifth node N5 and the seventh node N7. The ninth switch S9 is coupled between the seventh node N7 and a ground voltage Vss. The precharge switch P1 may be implemented using a PMOS transistor and is coupled between a power source voltage Vcc and the fourth node N4.

Figure 2:
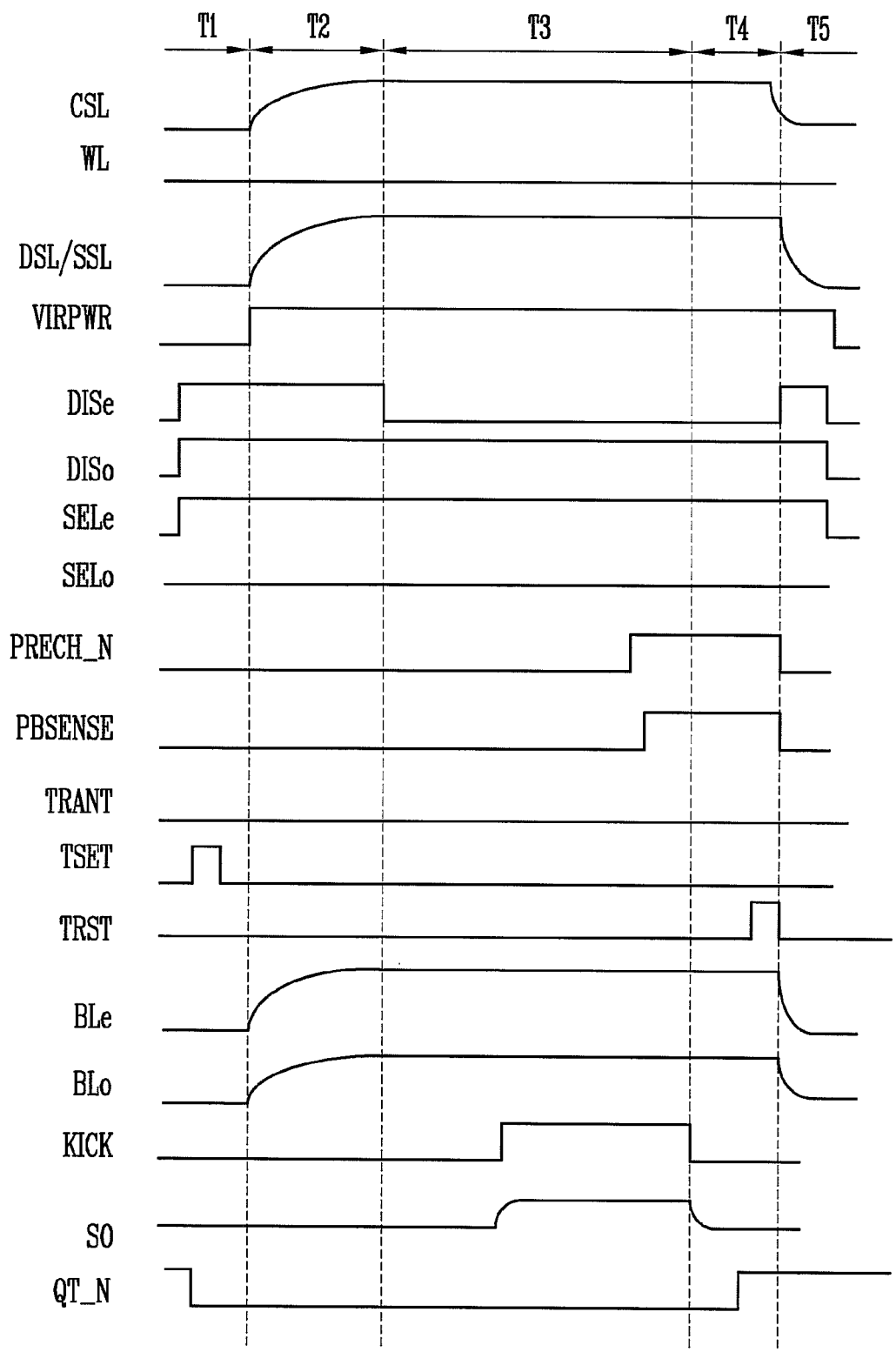
FIG. 2 is a timing diagram illustrating the erase method of a flash device according to an embodiment.

FIG. 2 is a timing diagram illustrating the erase method of the flash device according to an embodiment.

Referring to FIGS. 1 and 2, in a page buffer setup period T1, an odd bit line select signal SELo and a transfer signal TRANT are inactivated during an erase operation, so that the fourth switch S4 and the sixth switch S6 remain turned off. A precharge signal PRECH_N is activated (for example, a logic low), thereby turning on the precharge switch P1. When the precharge switch P1 is turned on, the power source voltage Vcc is supplied to the fourth node N4, so that the ninth switch S9 is turned on. Even and odd discharge signals DISe and DISo are activated (for example, a logic high), thereby turning on the first and second switches S1 and S2. The even bit line select signal SELe is activated (for example, a logic high), thereby turning on the third switch S3. An odd bit line select signal SELo is inactivated (for example, a logic low), thereby turning off the fourth switch S4. Accordingly, the third node N3 is electrically coupled to the even bit line BLe. A setup signal TSET is activated (for example, a logic high), so that data QT_N of the fifth node N5 is configured to be a logic low and is then inactivated.

In a virtual voltage supply period T2, the virtual voltage VIRPWR for an erase voltage is activated (for example, a logic high). Here, the power source voltage Vcc (for example, 20 V) may be applied because the virtual voltage VIRPWR is an erase voltage for an erase operation. In this case, since the even and odd discharge switches DISe and DISo are all turned on, the voltage levels of the even bit line BLe and the odd bit line BLo can be raised at the same time. If the voltage levels of the even bit line BLe and the odd bit line BLo are equal to each other as described above, a capacitive coupling effect between a selected bit line (for example, the even bit line) and an unselected bit line (for example, the odd bit line) can be prevented during an erase operation.

In an erase period T3, after the even bit line BLe has been sufficiently charged in the virtual voltage supply period T2, the even discharge signal DISe is inactivated, thereby turning off the first switch S1, keeping the odd discharge signal DISo activated, and keeping the second switch S2 turned on. In this case, since the precharge signal PRECH_N and a sensing signal PBSENSE remains inactive, the voltage level of the sensing node SO is not changed. Accordingly, an additional operation for increasing the voltage level of the sensing node SO is not required. Next, when a boosting signal KICK is supplied to the capacitor C1, the voltage level at the gate of the capacitor C1 rises because of a boosting effect. Consequently, the voltage level of the sensing node SO also rises. If the voltage level of the sensing node SO has been sufficiently raised, for an erase verification operation, the precharge signal PRECH_N is inactivated, thereby turning off the precharge switch P1 and activating the sensing signal PBSENSE. Accordingly, the fifth switch S5 is turned on.

In a sensing period T4, when the boosting signal KICK is inactivated, the voltage level of the sensing node SO is changed depending on the state of a selected memory cell because the sensing signal PBSENSE has been activated. Next, when a reset signal TRST is activated and the seventh switch S7 is therefore turned on, the voltage level of the sixth node N6 drops to a ground voltage (for example, 0 V). Further, the data QT_N of the fifth node N5 switches to a logic high because of the first inverter I1. The above-operation of changing the voltage of the sensing node So depending on the state of a selected memory cell are described in more detail as follows. In the sensing period T4, even bit line select signal SELe, sensing signal PBSENSE and reset signal TRST are all at logic high states. During the sensing period T4, a voltage level of the bit line BLe, which is shown to be at a logic high state in FIG. 2, is transferred to the sensing node SO/N4 since the logic high PBSENSE turns on switch S5. If the sensing node SO/N4 is at logic high state when the bit line BLe is at a logic high state as shown in FIG. 2, switch S9 is turned on. At this time, both switches S9 and S7 are turned on since the sensing node SO/N4 and the reset signal TRST are at logic high states. When switches S9 and S7 are turned on, node N6 is switched to a logic low state and the inverter I2 outputs a logic high data QT_N. On the other hand, if the sensing node SO/N4 is at logic low when the bit line BLe is at a logic low state (not shown in FIG. 2), switch S9 is turned off. Accordingly, the node N6 is not switched to a logic low state and data QT_N remains at a logic low state. As described above, latch 202 is operated in response to a state of the sensing node SO/N4 and the timing of the transition of the data QT_N in FIG. 2 is in synchronism with the reset signal TRST.

In a page buffer reset period T5, the even discharge signal DISe is activated, and voltage applied to the drain and source select lines DSL and SSL is inactivated.

As described above, during an erase operation, the virtual signal VIRPWR, instead of the power source voltage via the precharge switch P1, is used as voltage for charging a selected bit line (for example, the even bit line). Accordingly, the operation of the page buffer 200 can be simplified, and a capacitive coupling effect can be prevented because there is no difference in the voltage level between a selected bit line and a unselected bit lines. Consequently, reliability of a flash memory device can be improved.

According to this disclosure, when the erase operation of a flash device, a virtual voltage supplied from a bit line selection unit, not a page buffer, is used as voltage applied to a bit line, and the virtual voltage is supplied to both even and odd bit lines. Accordingly, the erase operation can be simplified and, during an erase verification operation, an interference effect between the bit lines can be reduced.

What is claimed is:

1. An erase method of a flash device, comprising:
   precharging bit lines by applying a virtual voltage to the bit lines;
   erasing memory cells coupled to the bit lines in a state of precharging the bit lines;
   sensing a voltage level of the bit lines to verify the memory cells;
   using a capacitor to increase a voltage of a sensing node in response to an activation of a boosting signal during a time for performing the erasing of the memory cells; and
   inactivating the boosting signal to reduce the increased voltage of the sensing node and coupling the sensing node to a selected one of the bit lines during a time for performing the sensing of the voltage level of the bit lines.

2. The erase method of claim 1, wherein the precharging of the bit lines is performed by applying the virtual voltage to the bit lines via a bit line selection unit of a page buffer coupled to the bit lines.

3. The erase method of claim 2, wherein a sensing node of the page buffer and the bit lines are electrically disconnected during the precharge of the bit lines.

4. The erase method of claim 1, wherein the erasing of the memory cells is performed by supplying a ground voltage to all word lines coupled to the memory cells.

5. The erase method of claim 1, wherein the level of the precharged bit lines is maintained until a time for performing the sensing of the voltage level of the bit lines.

6. The erase method of claim 1, wherein the sensing of the voltage level of the bit lines is performed by sensing a level of the precharged bit lines.

7. The erase method of claim 1, wherein the virtual voltage is a power source voltage Vcc.

8. An erase method of a flash device, comprising:
   applying a ground voltage to a gate of each of memory cells;
   applying a virtual voltage to bit lines, wherein the virtual voltage is a power source voltage;
   erasing the memory cells coupled to the bit lines;
   sensing a voltage level of the bit lines to verify the memory cells;
   using a capacitor to increase a voltage of a sensing node in response to an activation of a boosting signal during a time for performing the erasing of the memory cells; and
   inactivating the boosting signal to reduce the increased voltage of the sensing node and coupling the sensing node to a selected one of the bit lines during a time for performing the sensing of the voltage level of the bit lines.

9. The erase method of claim 8, wherein the virtual voltage is applied to the bit lines via a bit line selection unit of a page buffer coupled to the bit lines.

10. The erase method of claim 9, wherein a sensing node of the page buffer and the bit lines are electrically disconnected during the application of the virtual voltage to the bit lines.

11. The erase method of claim 8, wherein the erasing of the memory cells is performed by supplying a ground voltage to all word lines coupled to the memory cells.

12. The erase method of claim 8, wherein the level of the precharged bit lines is maintained until a time for performing the sensing of the voltage level of the bit lines.

13. The erase method of claim 12, wherein the sensing of the level of the precharged bit lines is performed by sensing a level of the precharged bit lines.

14. An erase method of a flash device, comprising:
   precharging bit lines by applying a virtual voltage to the bit lines, wherein the virtual voltage is applied from a bit line selection unit of a page buffer coupled to the bit lines;
   erasing memory cells coupled to the bit lines in a state of precharging the bit lines;
   sensing a voltage level of the bit lines to verify the memory cells;
   using a capacitor to increase a voltage of a sensing node in response to an activation of a boosting signal during a time for performing the erasing of the memory cells; and
   inactivating the boosting signal to reduce the increased voltage of the sensing node and coupling the sensing node to a selected one of the bit lines during a time for performing the sensing of the voltage level of the bit lines.

15. The erase method of claim 14, wherein the bit line selection unit comprises:
   a first switch to transfer the virtual voltage to one of the bit lines;
   a second switch to transfer the virtual voltage to another bit line;
   a third switch to select one bit line coupled to the first switch; and
   a fourth switch to select another bit line coupled to the second switch.

16. The erase method of claim 15, wherein the first and second switches are turned on at the same time to precharge the bit lines with the virtual voltage.

17. The erase method of claim 14, wherein a sensing node of the page buffer and the bit lines are electrically disconnected during the precharging the bit lines.

18. The erase method of claim 14, wherein the voltage level of the precharged bit lines is maintained until the sensing the voltage level of the bit lines.

19. The erase method of claim 14, wherein the sensing of the voltage level of the bit lines is performed by sensing a level of the precharged bit lines.

20. The erase method of claim 14, wherein the virtual voltage is a power source voltage Vcc.

* * * * *